SEMICONDUCTOR RECTIFIER CELL UNIT AND METHOD OF UTILIZING THE SAME

Filed March 13, 1961

INVENTORS
GEORGE E. FITZGIBBON
HERBERT PACKER
CLARENCE HUETTEN
BY
ATTORNEY

United States Patent Office 3,222,579
Patented Dec. 7, 1965

3,222,579
SEMICONDUCTOR RECTIFIER CELL UNIT AND METHOD OF UTILIZING THE SAME

George E. Fitzgibbon, Herbert Packer, and Clarence Huetten, Indianapolis, Ind., assignors to P. R. Mallory & Co., Inc., Indianapolis, Ind., a corporation of Delaware Filed Mar. 13, 1961, Ser. No. 95,085
11 Claims. (Cl. 317—234)

Figure 1:
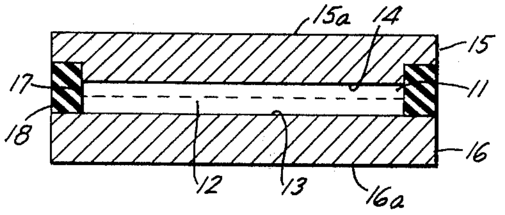

This invention relates to semiconductor rectifiers, and more particularly to a semiconductor rectifier cell unit of minute size and standard physical configuration which may be readily assembled into a complete rectifier of any of a wide variety of different physical configurations. The invention additionally relates to methods of assembling complete rectifiers from such semiconductor rectifier cell units.

An especially critical problem involved in producing semiconductor rectifiers of acceptable quality is that of preventing surface contamination of the semiconductor wafers included therein. This is most difficult in the case of silicon semiconductors because of the high surface activity thereof, but is also encountered to an important degree with all types of semiconductor materials. Since some exposure to moisture and other contaminants inevitably occurs in the course of the various operations by which the complete rectifier structure is assembled, it has been necessary to place the electrical contact members of the complete rectifier into position and to bond them to the semiconductor wafer prior to effecting final etching and cleaning of the wafer. The subassembly so produced is thereafter handled under extremely sanitary conditions so as to prevent further contamination during the handling operations preparatory to encapsulating it either in a suitable resin or a hermetically sealed container.

From an economy standpoint the foregoing mode of rectifier assembly has a number of shortcomings. Since the electrical contact members must withstand the corrosive action of the etching solution they must be plated or otherwise protected with a coating of conductive inert metal such as gold. This involves considerable expense, inasmuch as the contact members are far more massive and of much greater surface area than the wafer itself. Additionally, since the contact members suffer some degree of attack by the etching solution in spite of the protective coating thereon, the solution becomes contaminated more rapidly and must be replaced more often than if only the wafer itself were being etched. An even more serious disadvantage of this mode of rectifier assembly is that the semiconductor wafer is not fully protected from surface contaminaton until the complete rectifier structure is fully assembled. The wafer, therefore, cannot be electrically tested and evaluated in advance, so that a faulty wafer necessarily results in rejection of an entire rectifier assembly and materially increases the overall cost of production. Production cost is still further increased by virtue of the fact that each physically different type of complete rectifier structure calls for contact members of different physical configurations appropriate thereto. Inasmuch as surface contamination must continually be guarded against, this means that each type of rectifier structure necessitates virtually a complete production line specific thereto.

Accordingly, an object of the invention is to provide a completely self-protected semiconductor rectifier cell unit of minute size and standard physical configuration adapted to be assembled into any of a variety of physically different complete rectifier structures.

A further object is to provide a completely self-protected semiconductor rectifier cell unit which may be assembled into a completed rectifier structure without requiring any additional sanitary precautions or etching operations.

A further object is to provide a completely self-protected semiconductor rectifier cell unit of minute size and standard physical configuration which may be electrically tested in advance to ascertain whether its electrical characteristics merit assembling such cell unit into a complete rectifier structure.

A further object is to provide a method for assembling a complete semiconductor rectifier of specified physical configuration by a process including subassembly of a fully self-protected pretested semiconductor cell unit of minute size and standard configuration.

Pursuant to the foregoing objects, the invention provides a completely self-protected semiconductor rectifier cell unit of minute size and standard physical configuration adapted to be readily assembled into a complete rectifier structure of specified physical configuration. In one embodiment thereof such a rectifier cell unit comprises a longitudinally thin semiconductor wafer having a transverse PN junction therein and substantially planar transverse end surfaces. The cell unit additionally comprises a pair of longitudinally short studs of etch-resistant conductive metal each having a substantially planar surface at each transverse end thereof, one such transverse surface of each stud being bonded to and completely covering respective ones of the transverse end surfaces of the wafer, and at least a portion of the longitudinal periphery of each stud overhanging the longitudinal peripheral surface of the wafer so that both studs together form a channel there-between transversely encompassing such peripheral surface of the wafer. Finally, the cell unit comprises a moisture-resistant cohesive protective coating contained in the foregoing channel between the studs and sealing the longitudinal peripheral surface of the wafer against external contamination, the channel serving to support and retain the coating intact and in contact with that surface.

The invention additionally provides a method for assembling a semiconductor rectifier of specified physical configuration by a process which includes subassembly of a fully self-protected pretested semiconductor rectifier cell unit of minute size and standard physical configuration. In one embodiment such a method may comprise preparing a longitudinally thin semiconductor wafer having a transverse PN junction therein and substantially planar transverse end surfaces. The method further comprises preparing a pair of longitudinally short studs of etch-resistant conductive metal each having a substantially planar surface at each transverse end thereof. The wafer is then transversely bonded between the studs so that one transverse end of each stud completely covers the adjacent transverse end of the wafer and the longitudinal periphery of each stud overhangs the longitudinal peripheral surface of the wafer, thereby forming a channel between the studs which transversely encompasses the peripheral surface of the wafer. The bonded assembly so produced is then subjected to an acid etching solution which etches and removes surface contaminants from the longitudinal peripheral surface of the wafer, following which the assembly is rinsed and dried clear of the etching solution. The method next comprises filling the foregoing channel between the studs with a moisture-resistant cohesive protective coating so as to seal the longitudinal peripheral surface of the wafer against external contamination, thereby completing the subassembly of a self-protected semiconductor rectifier cell unit. The method next comprises making temporary electrical contact to the studs and measuring selected electrical characteristics of the cell unit so as to establish the electrical acceptability thereof. Following this a pair of electrical contact members are respectively affixed to the remaining transverse ends of the studs, the size and shape of such contact members being appropriate to a complete rectifier structure of the specified physical configuration. Finally, the assembly of the contact members and the cell unit is encapsulated so as to obtain a complete rectifier structure having the specified physical configuration.

Figure 2:
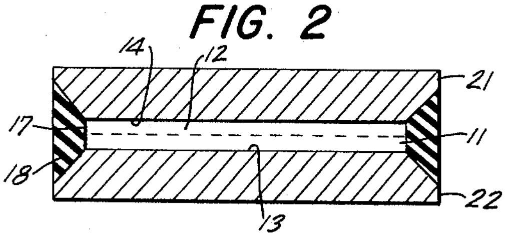
Figure 3A:
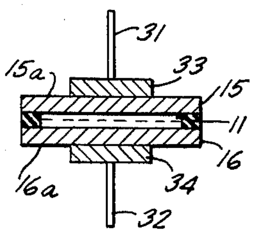
Figure 3B:
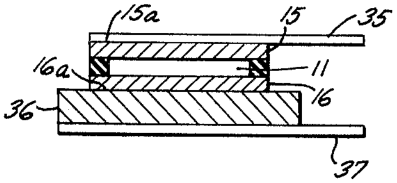
Figure 3C:
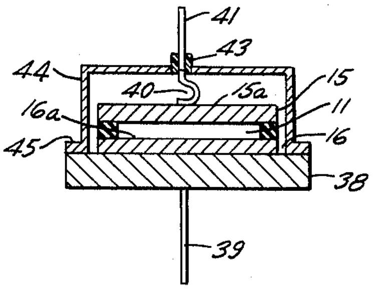

A more complete description of the invention, together with additional objects and features thereof, is presented in the following specification with reference to the accompanying drawings. However, it should be noted that the actual scope of the invention is pointed out in the ensuing claims. In the drawings:

FIG. 1 is a sectional diagram of a semiconductor rectifier cell unit constructed in accordance with the invention;

FIG. 2 is a sectional diagram of a modified physical configuration of a semiconductor rectifier cell unit constructed in accordance with the invention; and FIGS. 3*a*, 3*b*, and 3*c*, respectively are sectional diagrams of three different types of physical configurations of a complete rectifier assembled from a semiconductor rectifier cell unit of minute size and standard physical configuration constructed in accordance with the invention.

The semiconductor rectifier cell unit illustrated in FIG. 1 is of minute size and standard physical configuration adapted to be readily assembled into a complete rectifier structure of any of a variety of physical configurations. It is, in addition, completely self-protected from external contamination. Such a cell unit comprises a longitudinally thin semiconductor wafer 11 having a transverse PN junction 12 therein and substantially planar transverse end surfaces 13 and 14. For example, wafer 11 may be in the form of a thin circular disc of the order of 0.01 inch in thickness and 0.08 inch in diameter. Of course, the wafer could equally well be of thin rectangular or square form, the particular shape being determined by the manner in which the wafer is prepared and the required electrical characteristics of the complete rectifier. The wafer may be composed of germanium, silicon, gallium arsenide, or any other semiconductor element or compound capable of operation as a PN junction rectifier. At the present time silicon is the preferred material because of its ability to operate at higher temperatures and power levels. In order to enable soldered connections of low resistance to be readily made to the wafer each of its transverse end surfaces 13 and 14 is prefably plated with a thin layer of nickel, for example 0.05 mil or less in thickness.

A semiconductor wafer of the foregoing type may be prepared by techniques which are well known in the art. In substance, a single crystal of the selected semiconductor material, weakly doped with either a P or N type impurity, is grown by slowly longitudinally withdrawing it from a melt of that material. A thin transverse slice is then cut from the grown crystal, and either by alloying or gaseous diffusion an impurity of the opposite type is diffused to a predetermined depth into one or both transverse faces of the slice. The opposite face is then lapped to remove the unnecessary junction thereat, following which an impurity of the same type as the original crystal is diffused into that face. Both faces are then lapped smooth and substantially planar, following which they are each coated with a thin layer of nickel in low resistance ohmic contact therewith as mentioned above. This may be accomplished by the well known "electroless" plating technique. Up to this stage the slice is of sizeable diameter, of the order of 0.75 to 1.0 inch. Accordingly, it may be longitudinally cut or "diced" into many minute individual "wafers" of the kind previously referred to by means of an ultrasonic cutting machine or by scribing with a diamond tool. Ultrasonic cutting will yield round wafers, while diamond scribing technique usually results in square or rectangular wafers.

The rectifier cell in FIG. 1 additionally comprises a pair of longitudinally short studs 15 and 16 of etch-resistant conductive metal each having a substantially planar surface at each transverse end thereof. One transverse surface of stud 15 is bonded to and completely covers transverse end surface 14 of wafer 11, one of the transverse surfaces of stud 16 similarly being bonded to and completely covering the other transverse surface 13 of wafer 11. In addition, at least a portion of the longitudinal periphery of each of the studs overhangs the longitudinal peripheral surface 17 of the wafer so that both studs together form a channel therebetween transversely encompassing the peripheral surface 17. More specifically, each of studs 15 and 16 may be of the order of 0.025 inch in thickness and composed of a conductive metal or alloy which is plated or otherwise clad with a thin layer of conductive etch-resistant metal such as gold over its entire surface. The metal or alloy employed may, for example, be steel, copper, Kovor, or Armco iron. The studs may be of circular, square, rectangular, or other cross-sectional shape. However, assuming that wafer 11 is a circular disc having planar transverse end surfaces of equal periphery, each of studs 15 and 16 is most conveniently also of circular cross-section. In the particular embodiment illustrated in FIG. 1, the aforementioned channel is established by having each of studs 15 and 16 of cylindrical shape, the periphery of each overhanging the longitudinal peripheral surface 17 of wafer 11. The channel so formed is of rectangular cross-section and transversely encompasses longitudinal peripheral surface 17 of wafer 11. Thus, if the wafer is a disc having a diameter of 0.08 inch, which is typical, the outer transverse end surfaces **15*a* and 16*a* of studs 15 and 16 may each be about 0.1 inch in diameter. The rectangular peripheral channel will therefore be about 0.1 inch in depth around peripheral surface 17. Stud 15** has been illustrated as having the overhanging annular peripheral region thereof slightly longitudinally recessed so as to permit both studs to be readily distinguished from each other. However, it is equally feasible to have both studs of identical shape and to provide individual identification in other ways. For example one stud could be made of an alloy permitting it to be magnetized to a slight degree, so that a disconcernible effect would be produced on a magnetic test probe brought into its vicinity.

Bonding of each transverse end surface of wafer 11 to respective transverse end surfaces of studs 15 and 16 may be readily effected by sandwiching a preformed wafer of solder, which may equally well be of low or high melting point, between those surfaces and then heating the entire assembly until the solder fuses. The bonded assembly so produced is then subjected to an acid etching solution which dissolves away any excess solder which may have flowed over the longitudinal peripheral surface 17 of wafer 11 and also etches and removes any other surface contaminants which may have adhered thereto. Inasmuch as both studs are coated with gold or other conductive etch-resistant metal they are protected from attack by the etching solution. The bonded assembly is then rinsed and dried clear of the solution.

The rectifier cell unit in FIG. 1 further comprises a moisture-resistant cohesive protective coating 18 contained in the channel between studs 15 and 16 and sealing the longitudinal peripheral surface 17 of wafer 11 against external contamination. A suitable protective coating for this purpose is silicone varnish. Inasmuch as the transverse surfaces 13 and 14 of wafer 11 are completely covered by the studs 15 and 16 bonded thereto, completion of the addition of the protective coating as described will result in a complete rectifier cell unit which is entirely self-protected and which may be freely handled further without special precaution to avoid contamination of the wafer.

The reason for forming studs 15 and 16 so as to provide a channel transversely encompassing longitudinal peripheral surface 17 of wafer 11 is to provide necessary support for the protective coating 18 placed therein. Since such coatings possess very little structural strength, there would otherwise be a likelihood of fissures developing therein and consequent entry of impurities having adverse effect on the electrical characteristics of wafer 11. However, it will be apparent that other physical configurations of the studs besides that shown in FIG. 1 can also establish such a channel. For example, in FIG. 2 is shown in cross-section a rectifier cell unit substantially the same as that of FIG. 1 except that the studs 21 and 22 therein extend longitudinally back from the wafer with conically tapered increasing transverse periphery. Both studs together thus form a conically tapered or V shaped channel transversely encompassing the longitudinal peripheral surface 17 of the wafer, and may be filled with the moisture-resistant protective coating 18 in the same manner as was the rectangular channel in FIG. 1. The peripheral edges of studs 21 and 22 at their outermost transverse surfaces may be slightly chamfered in order to reduce the mechanical stress thereat.

A semiconductor rectifier cell of the type shown in each of FIGS. 1 and 2 can be readily assembled into a variety of complete rectifier structures, the cell unit itself being of standard physical configuration and minute size of the order of 0.1 inch in diameter and 0.06 inch in thickness. For example, in FIG. 3*a* is shown in cross-section an axial lead rectifier structure comprising a pair of conductors 31 and 32 respectively coaxially affixed to a pair of disc contact members 33 and 34 which are soldered to transverse surfaces 15*a* and 16*a* of a rectifier cell of the type described above with reference to FIG. 1. FIG. 3*b* shows in cross-section a parallel lead rectifier structure wherein one of the contact members 35 is a cylindrical conductor directly soldered over a portion of its length to transverse end surface 15*a* of stud 15 of a rectifier cell unit as in FIG. 1. The other contact member is a relatively massive conductive metal base 36 which is soldered to transverse end surface 16*a* of the other stud 16 of the cell unit. A cylindrical conductor 37 is, in turn, soldered over a portion of its length to base member 36. This not only provides an axial arrangement of conductors or leads 35 and 37, but base 36 serves as a heat dissipation medium for the cell unit. In FIG. 3*c* is shown in cross-section a "top hat" rectifier structure. In this case the transverse end surface 16*a* of stud 16 of a rectifier cell unit constructed as in FIG. 1 is soldered to a relatively massive conductive base contact member 38 which has a conductor 39 coaxially affixed to the opposite surface thereof. A spring contact member 40 is coaxially welded or soldered to transverse surface 15*a* of the other stud 15 of the cell unit, and is itself connected to a conductor 41. The latter extends through and is supported by an insulating bushing 43 in the top of a protective metal cover 44 which has a base rim 45 soldered to the peripheral edge of base member 38. Soldering of the cover to the base is preferably effected under vacuum or in an inert gas atmosphere so as to prevent water vapor or other contaminants from being sealed in with the cell unit. This type of rectifier structure provides an extremely high degree of long time reliability.

A major advantage of assembling a semiconductor rectifier by a process which includes subassembly of a fully self-protected semiconductor rectifier cell unit in accordance with the invention is that the cell unit can be tested in advance to assure that the completed rectifier will have electrical characteristics meeting prescribed specifications. Specifically, temporary electrical contact may be made to the remaining exterior transverse ends of the studs to enable electrical connection to test equipment which measures selected electrical characteristics of the cell unit. That is, in the case of a cell as in FIG. 1 sharply pointed electrical probes may be pressed against transverse surfaces 15*a* and 16*a* of studs 15 and 16 and connected to electrical testing apparatus for measuring inverse breakdown voltage and the forward voltage vs. current characteristic of the cell unit. Inasmuch as the cell unit is the electrically significant component of the complete rectifier assembled therefrom, the performance of the complete rectifier will necessarily closely follow that of the cell unit itself. Once having determined the acceptability of the electrical characteristics of the unit, a pair of electrical contact members may be respectively affixed to the transverse end surfaces of the studs thereof, the size and shape of such contact members being appropriate to a complete rectifier structure of the specified physical configuration in each particular case. This will be clear from FIGS. 3*a*, 3*b*, and 3*c*, wherein it is seen that the contact members affixed to the studs of the cell unit depend on the ultimate physical shape of the complete rectifier. In FIG. 3*a* the contact members are the small discs 33 and 34. In FIG. 3*b* the contact members are the conductor 35 and the metal base 36. In FIG. 3*c* the contact members comprise metal base 38 and spring contact 40.

The final step in assembling a complete rectifier including a self-protected pretested semiconductor rectifier cell unit as described is to encapsulate the assembly of the cell unit and the contact members affixed thereto so as to obtain a complete structure of the specified configuration appropriate to the contact members. That is, in each of FIGS. 3*a* and 3*b* the illustrated structures may be subsequently impregnated with a thick coating of an epoxy resin which preferably contains a metal or ceramic powder in order to aid in heat dissipation. In FIG. 3*c* final encapsulation involves placing the cover 44 in place on base contact member 38 and spring contact 40 and welding the rim of the cover to the peripheral edge of the base member.

While the invention has been described with reference to certain specific embodiments thereof, both as to its structure and method, it will be apparent to those skilled in the art that many modifications and variations thereof may be made without departing from the true teachings and scope of the invention as set forth in the ensuing claims.

What is claimed is:

1. A self-protected semiconductor rectifier cell unit of minute size and standard physical configuration adapted to be readily assembled into a complete rectifier structure of specified physical configuration, said cell unit comprising: a longitudinally thin semiconductor wafer having a transverse PN junction therein and substantially planar transverse end surfaces; a pair of longitudinally short studs of gold metal so as to be etch-resistant each having a substantially planar surface at each transverse end thereof, one such transverse surface of each stud being bonded to and completely covering respective ones of the transverse surfaces of said wafer, and at least a portion of the longitudinal periphery of each stud overhanging the longitudinal peripheral surface of the wafer so that both studs together form a channel there-between transversely encompassing said peripheral surface of said wafer; one of said studs including a recessed longitudinal periphery, said recess for polarity identification of said semiconductor rectifier cell unit; and a moisture-resistant cohesive protective coating contained in said channel between said studs so as to seal the longitudinal peripheral surface of said wafer against external contamination, the channel serving to support and retain said coating intact and in contact with that surface.

2. A self-protected semiconductor rectifier cell unit of minute size and standard physical configuration adapted to be readily assembled into a complete rectifier structure of a specified physical configuration, said cell unit comprising: a longitudinally thin semiconductor wafer having a transverse PN junction therein and substantially planar transverse end surfaces; a pair of longitudinally short studs of conductive metal coated with a thin layer of gold metal so as to be etch-resistant and each having a substantially planar surface at each transverse end thereof, one such transverse surface of each stud being bonded to and completely covering respective ones of the transverse surfaces of said wafer, and at least a portion of the longitudinal periphery of each stud overhanging the longitudinal peripheral surface of the wafer so that both studs together form a channel there-between transversely encompassing said peripheral surface of said wafer; one of said studs including a recessed longitudinal periphery, said recess for polarity identification of said semiconductor rectifier cell unit; and a moisture-resistant cohesive protective coating contained in said channel between said studs so as to seal the longitudinal peripheral surface of said wafer against external contamination, the channel serving to support and retain said coating intact and in contact with that surface.

3. A self-protected semiconductor rectifier cell unit of minute size and standard physical configuration adapted to be readily assembled into a complete rectifier structure of specified physical configuration, said cell unit comprising: a longitudinally thin semiconductor wafer having a transverse PN junction therein and substantially planar transverse end surfaces; a pair of longitudinally short studs of gold metal so as to be etch-resistant each having a substantially planar surface at each transverse end thereof, one such transverse surface of each stud being bonded to and completely covering respective ones of the transverse surfaces of said wafer, and at least a portion of the longitudinal periphery of each stud overhanging the longitudinal peripheral surface of the wafer so that both studs together form a channel there-between transversely encompassing said peripheral surface of said wafer; one of said studs including a recessed longitudinal periphery, said recess for polarity identification of said semiconductor rectifier cell unit; and a moisture-resistant cohesive silicone varnish contained in said channel between said studs so as to seal the longitudinal peripheral surface of said wafer against external contamination, the channel serving to support and retain said varnish intact and in contact with that surface.

4. A self-protected semiconductor rectifier cell unit of minute size and standard physical configuration adapted to be readily assembled into a complete rectifier structure of specified physical configuration, said cell unit comprising: a longitudinally thin semiconductor wafer having a transverse PN junction therein and substantially planar transverse end surfaces; a pair of longitudinally short studs of conductive metal coated with a thin layer of gold metal so as to be etch-resistant and each having a substantially planar surface at each transverse end thereof, one such transverse surface of each stud being bonded to and completely covering respective ones of the transverse surfaces of said wafer, and at least a portion of the longitudinal periphery of each stud overhanging the longitudinal peripheral surface of the wafer so that both studs together form a channel there-between transversely encompassing said peripheral surface of said wafer; one of said studs including a recessed longitudinal periphery, said recess for polarity identification of said semiconductor cell unit; and a moisture-resistant cohesive silicone varnish contained in said channel between said studs so as to seal the longitudinal peripheral surface of said wafer against external contamination, the channel serving to support and retain said varnish intact and in contact with that surface.

5. A self-protected semiconductor rectifier unit of minute size and standard physical configuration adapted to be readily assembled into a complete rectifier structure of specified physical configuration, said cell unit comprising: a longitudinally thin semiconductor wafer having a transverse PN junction therein and substantially planar transverse end surfaces of equal periphery; a pair of longitudinally short cylindrical studs of gold metal so as to be etch-resistant each having a substantially planar surface at each transverse end thereof, one such transverse surface of each stud being bonded to and completely covering respective ones of the transverse end surfaces of said wafer, and the periphery of each stud overhanging the longitudinal peripheral surface of the wafer so that both studs together form a channel there-between transversely encompassing said peripheral surface of said wafer; one of said studs including a recessed longitudinal periphery, said recess for polarity identification of said semiconductor rectifier cell unit; and a moisture-resistant cohesive protectife coating contained in said channel between said studs so as to seal the longitudinal peripheral surface of said wafer against external contamination, the channel serving to support and retain said coating intact and in contact with that surface.

6. A self-protected semiconductor rectifier cell unit of minute size and standard physical configuration adapted to be readily assembled into a complete rectifier structure of specified physical configuration, said cell unit comprising: a longitudinally thin semiconductor wafer having a transverse PN junction therein and substantially planar transverse end surfaces of equal periphery; a pair of longitudinally short cylindrical studs of conductive metal coated with a thin layer of gold metal so as to be etch-resistant and each having a substantially planar surface at each transverse end thereof, one such transverse surface of each stud being bonded to and completely covering respective ones of the transverse end surfaces of said wafer, and the periphery of each stud overhanging the longitudinal peripheral surface of the wafer so that both studs together form a channel there-between transversely encompassing said peripheral surface of said wafer; one of said studs including a recessed longitudinal periphery, said recess for polarity identification of said semiconductor cell unit; and a moisture-resistant cohesive protective coating contained in said channel between said studs so as to seal the longitudinal peripheral surface of said wafer against external contamination, the channel serving to support and retain said coating intact and in contact with that surface.

7. A self-protected semiconductor rectifier cell unit of minute size and standard physical configuration adapted to be readily assembled into a complete rectifier structure of specified physical configuration, said cell unit comprising: a longitudinally thin semiconductor wafer having a transverse PN junction therein and substantially planar transverse end surfaces of equal periphery; a pair of longitudinally short studs of gold metal so as to be etch-resistant each having a substantially planar surface at each transverse end thereof, one such transverse surface of each stud being bonded to and completely covering respective ones of the transverse end surfaces of said wafer, and each stud extending longitudinally back from the wafer with conically tapered increasing transverse periphery so that both studs together form a conically tapered channel there-between transversely encompassing the longitudinal peripheral surface of said wafer; and a moisture-resistant cohesive protective coating contained in said channel between said studs so as to seal the longitudinal peripheral surface of said wafer against external contamination, the channel serving to support and retain said coating intact and in contact with that surface.

8. A self-protected semiconductor rectifier cell unit of minute size and standard physical configuration adapted to be readily assembled into a complete rectifier structure of specified physical configuration, said cell unit comprising: a longitudinally thin semiconductor wafer having a transverse PN junction therein and substantially planar transverse end surfaces of equal periphery; a pair of longitudinally short studs of conductive metal coated with a thin layer of gold metal so as to be etch-resistant and each having a substantially planar surface at each transverse end thereof, one such transverse surface of each stud being bonded to and completely covering respective ones of the transverse end surfaces of said wafer, and each stud extending longitudinally back from the wafer with conically tapered increasing transverse periphery so that both studs together form a conically tapered channel there-between transversely encompassing the longitudinal peripheral surface of said wafer; and a moisture-resistant cohesive silicone varnish contained in said channel between said studs so as to seal the longitudinal peripheral surface of said wafer against external contamination, the channel serving to support and retain said varnish intact and in contact with that surface.

9. A method for assembling a semiconductor rectifier of specified physical configuration by a process which includes subassembly of a fully self-protected pretested semiconductor rectifier cell unit of minute size and standard physical configuration, said method comprising: preparing a longitudinally thin semiconductor wafer having a transverse PN junction therein and substantially planar transverse end surfaces; preparing a pair of longitudinally short studs of gold metal so as to be etch-resistant each having a substantially planar surface at each transverse end thereof; bonding said wafer transversely between said studs so that one transverse end of each stud completely covers the adjacent transverse end of the wafer and the longitudinal periphery of each stud overhangs the longitudinal peripheral surface of the wafer, thereby forming a channel between the studs which transversely encompasses the peripheral surface of said wafer; subjecting the bonded assembly so produced to an acid etching solution which etches and removes surface contaminants from the longitudinal peripheral surface of said wafer; rinsing and drying said bonded assembly of said solution; filling said channel between said studs with a moisture-resistant cohesive protective coating so as to seal the longitudinal peripheral surface of said wafer against external contamination, thereby completing subassembly of a self-protected semiconductor rectifier cell unit; making temporary electrical contact to the remaining transverse ends of said studs and measuring selected electrical characteristics of said cell unit to establish the electrical acceptability thereof; affixing a pair of electrical contact members respectively to said remaining transverse ends of said studs, the size and shape of said contact members being appropriate to a complete rectifier structure of said specified physical configuration; and encapsulating the assembly of said contact members and said cell unit so as to obtain a complete rectifier structure having said specified physical configuration.

10. A method for assembling a semiconductor rectifier of specified physical configuration by a process which includes subassembly of a fully self-protected pretested semiconductor rectifier cell unit of minute size and standard physical configuration, said method comprising: preparing a longitudinally thin semiconductor wafer having a transverse PN junction therein and substantially planar transverse end surfaces; preparing a pair of longitudinally short studs of conductive metal coated with a thin layer of gold metal so as to be etch-resistant and each having a substantially planar surface at each transverse end thereof; bonding said wafer transversely between said studs so that one transverse end of each stud completely covers the adjacent transverse end of the wafer and the longitudinal periphery of each stud overhangs the longitudinal peripheral surface of the wafer, thereby forming a channel between the studs which transversely encompasses the peripheral surface of said wafer; subjecting the bonded assembly so produced to an acid etching solution which etches and removes surface contaminants from the longitudinal peripheral surface of said wafer; rinsing and drying said bonded assembly clear of said solution; filling said channel between said studs with a moisture-resistant cohesive protective coating so as to seal the longitudinal peripheral surface of said wafer against external contamination, thereby completing subassembly of a self-protected semiconductor rectifier cell unit; making temporary electrical contact to the remaining transverse ends of said studs and measuring selected electrical characteristics of said cell unit to establish the electrical acceptability thereof; affixing a pair of electrical contact members respectively to said remaining transverse ends of said studs, the size and shape of said contact members being appropriate to a complete rectifier structure of said specified physical configuration; and encapsulating the assembly of said contact members and said cell unit so as to obtain a complete rectifier structure having said specified physical configuration.

11. A method for assembling a semiconductor rectifier of specified physical configuration by a process which includes subassembly of a fully self-protected pretested semiconductor rectifier cell unit of minute size and standard physical configuration, said method comprising: preparing a longitudinally thin semiconductor wafer having a transverse PN junction therein and substantially planar transverse end surfaces; preparing a pair of longitudinally short studs of conductive metal coated with a thin layer of gold metal so as to be etch-resistant and each having a substantially planar surface at each transverse end thereof; soldering one transverse end of each of said studs to respective ones of the transverse ends of said wafer so as to completely cover said transverse ends of the wafer and so that the longitudinal periphery of each stud overhangs the longitudinal peripheral surface of the wafer, thereby forming a channel between the studs which transversely encompasses the peripheral surface of said wafer; subjecting the bonded assembly so produced to an acid etching solution which etches and removes surface contaminants from the longitudinal peripheral surface of said wafer; rinsing and drying said bonded assembly clear of said solution; filling said channel with a moisture-resistant cohesive silicone varnish so as to seal the longitudinal peripheral surface of said wafer against external contamination, thereby completing subassembly of a self-protected semiconductor cell unit; making temporary electrical contact to the remaining transverse ends of said studs and measuring selected electrical characteristics of said cell unit to establish the electrical acceptability thereof; affixing a pair of electrical contact members respectively to said remaining transverse ends of said studs, the size and shape of said contact members being appropriate to a complete rectifier structure of said specified physical configuration; and encapsulating the assembly of said contact members and said cell unit so as to obtain a complete rectifier structure having said specified physical configuration.

References Cited by the Examiner

UNITED STATES PATENTS

| | | | |
|---|---|---|---|
| 2,981,875 | 4/1961 | Kelley et al. | 317—235 |
| 3,002,133 | 9/1961 | Maiden et al. | 317—234 |
| 3,023,346 | 2/1962 | Wagner | 317—234 |
| 3,047,780 | 7/1962 | Metz | 317—234 |

JOHN W. HUCKERT, *Primary Examiner.*

SAMUEL BERNSTEIN, *Examiner.*

A. S. KATZ, *Assistant Examiner.*